(12) United States Patent
Hara

(10) Patent No.: US 7,553,713 B2
(45) Date of Patent: Jun. 30, 2009

(54) METHOD OF MANUFACTURING SEMICONDUCTOR SUBSTRATES AND SEMICONDUCTOR DEVICES

(75) Inventor: Toshiki Hara, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 351 days.

(21) Appl. No.: 11/263,891

(22) Filed: Oct. 31, 2005

(65) Prior Publication Data
US 2006/0091426 A1 May 4, 2006

(30) Foreign Application Priority Data
Oct. 29, 2004 (JP) .............................. 2004-315334

(51) Int. Cl.
- *H01L 21/84* (2006.01)
- *H01L 21/31* (2006.01)
- *H01L 21/3205* (2006.01)
- *H01L 21/336* (2006.01)
- *H01L 29/786* (2006.01)

(52) U.S. Cl. .................... 438/164; 438/438; 257/347; 257/E29.273; 257/E21.411; 257/E21.215

(58) Field of Classification Search ............... 257/211, 257/347, 348, 353, E29.273, E29.295, E21.411, 257/E21.415; 438/479, 149, 151, 164, 738
See application file for complete search history.

(56) References Cited

U.S. PATENT DOCUMENTS

| | | | |
|---|---|---|---|
| 5,482,877 A * | 1/1996 | Rhee | 438/157 |
| 5,952,694 A | 9/1999 | Miyawaki et al. | |
| 6,329,265 B1 | 12/2001 | Miyawaki et al. | |
| 6,537,894 B2 * | 3/2003 | Skotnicki et al. | 438/424 |
| 6,713,356 B1 * | 3/2004 | Skotnicki et al. | 438/285 |
| 6,724,049 B2 * | 4/2004 | Fujiwara | 257/354 |
| 7,078,298 B2 * | 7/2006 | Lee et al. | 438/285 |
| 7,205,587 B2 * | 4/2007 | Fujimaki | 257/197 |
| 7,285,455 B2 * | 10/2007 | Fujimaki | 438/202 |
| 7,316,943 B2 * | 1/2008 | Hara | 438/149 |
| 7,326,603 B2 * | 2/2008 | Kanemoto | 438/152 |
| 2004/0152272 A1 * | 8/2004 | Fladre et al. | 438/284 |
| 2004/0235262 A1 | 11/2004 | Lee et al. | |
| 2005/0176222 A1 * | 8/2005 | Ogura | 438/514 |
| 2006/0046409 A1 * | 3/2006 | Fujimaki | 438/309 |
| 2006/0071279 A1 * | 4/2006 | Kanemoto | 257/365 |

(Continued)

FOREIGN PATENT DOCUMENTS

JP          05-275665 A          10/1993

(Continued)

OTHER PUBLICATIONS

Sakai, et al., "Separation by Bonding Si Islands (SBSI) for LSI Applications." Second International SiGe Technology and Device Meeting Abstract, pp. 230-231, May 2004.

*Primary Examiner*—M. Wilczewski
(74) *Attorney, Agent, or Firm*—Edwards Angell Palmer & Dodge LLP; John J. Penny, Jr.; George N. Chaclas

(57) ABSTRACT

A semiconductor substrate includes a semiconductor base substrate that has an oxide film selectively formed on a part thereof, the oxide film having a non-uniform thickness; and a semiconductor layer that is formed on the oxide film by epitaxial growth so as to have a non-uniform thickness.

10 Claims, 8 Drawing Sheets

U.S. PATENT DOCUMENTS

| | | | |
|---|---|---|---|
| 2007/0004212 A1* | 1/2007 | Takizawa et al. | 438/694 |
| 2007/0020828 A1* | 1/2007 | Hara | 438/164 |
| 2007/0090400 A1* | 4/2007 | Fujimaki | 257/197 |
| 2008/0079053 A1* | 4/2008 | Gonzalez et al. | 257/314 |

FOREIGN PATENT DOCUMENTS

| | | |
|---|---|---|
| JP | 07-078994 | 3/1995 |
| JP | 07-335898 | 12/1995 |
| JP | 2001-102442 A | 4/2001 |
| JP | 2003-324200 | 11/2003 |

\* cited by examiner

METHOD OF MANUFACTURING SEMICONDUCTOR SUBSTRATES AND SEMICONDUCTOR DEVICES

Applicant claims foreign priority to Japanese Application No. 2004-315334 filed on Oct. 29, 2004, which is hereby incorporated by reference in its entirety.

BACKGROUND OF THE INVENTION

1. Technical Field

The present invention relates to a semiconductor substrate, to a semiconductor device, to a method of manufacturing a semiconductor substrate, and to a method of manufacturing a semiconductor device. In particular, the invention relates to a technique suitably applicable to field effect transistors formed on an SOI (silicon on insulator) substrate.

2. Related Art

Field effect transistors formed on an SOI substrate have drawn attention in terms of ease of element separation, latch-up free property, small source/drain junction capacitance, and so on. In particular, since a fully depleted SOI transistor has features, such as low power consumption, high-speed operation, and low-voltage driving, research for operating an SOI transistor in the fully depletion mode has been actively carried out. Here, the thicknesses of a BOX layer are different from each other in a channel region and in source/drain regions, which makes it possible to improve characteristics of the SOI transistor.

For example, the BOX layer is formed to have a smaller thickness below the channel region, which makes it possible to suppress a short channel effect. In addition, it is possible to reduce the amount of charges generated from a buried oxide film by radiating, for example, alpha-rays, in order to improve the reliability of a device in operation. On the other hand, the BOX layer is formed to have a larger thickness below the source/drain regions, which makes it possible to reduce parasitic capacitance of the source/drain regions. As a result, a high-speed operation can be achieved at a low voltage.

As a method of forming the BOX layer having a small thickness below the channel region and a large thickness below the source/drain regions, a method using a SIMOX (separation by implanted oxygen) technique has been disclosed in Japanese Unexamined Patent Application Publication Nos. 7-335898 and 7-78994.

That is, in the method disclosed in Japanese Unexamined Patent Application Publication No. 7-335898, an oxygen-ion implanting process and an annealing process are performed on a semiconductor substrate to form a BOX layer. In this case, when the annealing process is performed on the semiconductor substrate having oxygen ions implanted thereinto, an oxidation shielding mask is selectively formed on the semiconductor substrate, and a thermal oxidation treatment is performed thereon at a temperature of higher than 1150° C. for several hours. Then, an oxide film in a region not covered with the oxidation shielding mask grows, so that the thickness of the BOX layer becomes large in the region. However, the oxidation film in the other region covered with the oxidation shielding mask does not grow, so that the thickness of the BOX layer becomes smaller in this region.

Further, in the method disclosed in Japanese Unexamined Patent Application Publication No. 7-78994, a BOX layer having a non-uniform thickness is prepared by changing energy required for implanting oxygen ions. In this method, a thin oxide film is formed below a channel region before a field oxide film is formed. Then, after a gate electrode is formed, a thick oxide film is formed below a diffusion layer.

However, the method disclosed in Japanese Unexamined Patent Application Publication Nos. 7-335898 has problems in that oxygen ions should be implanted into the semiconductor substrate with a dosage of 1E17 to 1E18 cm$^{-2}$ and a longer manufacturing time and a high manufacturing cost are required. In addition, in order to manufacture the BOX layer, high-temperature annealing should be performed for a long time, and defects may occur in an Si single crystal layer.

Furthermore, the method disclosed in Japanese Unexamined Patent Application Publication No. 7-78994 has problems in that oxygen ions should be implanted into the semiconductor substrate with a dosage of larger than 1E18 cm$^{-2}$ and a longer manufacturing time and a high manufacturing cost are required. In addition, after a gate electrode is formed, annealing is performed thereon at a high temperature of about 1200° C. Therefore, redistribution of impurities occurs, and stress is applied to a gate oxide film and an Si single crystal layer.

SUMMARY

An advantage of at least one embodiment of the invention is that it provides a semiconductor substrate, a semiconductor device, a method of manufacturing a semiconductor substrate, and a method of manufacturing a semiconductor device capable of forming a BOX layer having a non-uniform thickness on a substrate, without using a SIMOX technique.

According to an aspect of at least one embodiment of the invention, a semiconductor substrate includes a semiconductor base substrate that has an oxide film selectively formed on a part thereof, the oxide film having a non-uniform thickness; and a semiconductor layer that is formed on the oxide film by epitaxial growth so as to have a non-uniform thickness.

According to the above-mentioned structure, it is possible to make a BOX layer having SOI transistors formed thereon to have a non-uniform thickness, without using the SIMOX technique. Thus, it is possible to prevent an increase in manufacturing costs, and to achieve transistors capable of operating at high speed with low power consumption.

Further, according to another aspect of at least one embodiment of the invention, a semiconductor device includes a semiconductor substrate that has an oxide film selectively formed on a part thereof, the oxide film having a non-uniform thickness; a semiconductor layer that is formed on the oxide film by epitaxial growth so as to have a non-uniform thickness; a gate electrode that is formed on a portion of the semiconductor layer having a larger thickness; and source/drain layers that are formed in regions of the semiconductor layer having a smaller thickness so as to be disposed at both sides of the gate electrode, respectively.

According to the above-mentioned structure, a BOX layer can be formed to have a small thickness below the channel and to have a large thickness below the source/drain layers, without using the SIMOX technique. Therefore, it is possible to suppress a short channel effect and to reduce parasitic capacitance of the source/drain layers. As a result, it is possible to achieve transistors capable of operating at high speed with low power consumption.

Furthermore, according to still another aspect of at least one embodiment of the invention, a method of manufacturing a semiconductor substrate includes forming a first semiconductor layer on a part of the semiconductor substrate so as to have a non-uniform thickness; forming a second semiconductor layer on the first semiconductor layer, the second semiconductor layer having a selectivity lower than that of the first semiconductor layer at the time of etching; forming an insulating film on the semiconductor substrate so as to cover the second semiconductor layer; forming an aperture in the insulating film, so that a part of an edge of the first semiconductor layer is exposed through the aperture; etching the first semiconductor layer through the aperture to form, below the second semiconductor layer, a cavity where the first semiconductor layer is removed; and forming an oxide film to fill up the cavity by performing a thermal oxidation treatment on the second semiconductor layer and the semiconductor substrate through the aperture.

According to the above-mentioned method, it is possible to make the second semiconductor layer have a non-uniform thickness, corresponding to the first semiconductor layer having a non-uniform thickness. In addition, it is possible to make a BOX layer have a non-uniform thickness, without damaging the crystal quality of the second semiconductor layer. Accordingly, SOI transistors can be formed on an oxide film having a non-uniform thickness, without using the SIMOX technique. Thus, it is possible to prevent an increase in manufacturing costs, and to achieve transistors capable of operating at high speed with low power consumption.

Moreover, according to yet another aspect of at least one embodiment of the invention, a method of manufacturing a semiconductor device includes forming a first semiconductor layer on a part of a semiconductor substrate; forming a second semiconductor layer on the first semiconductor layer, the second semiconductor layer having a selectivity lower than that of the first semiconductor layer at the time of etching; forming an insulating film on the semiconductor substrate so as to cover the second semiconductor layer; forming an aperture in the insulating film, so that a part of an edge of the first semiconductor layer is exposed through the aperture; etching the first semiconductor layer and the second semiconductor layer through the aperture to form, below the second semiconductor layer, a cavity where the first semiconductor layer is removed, such that the thickness of the second semiconductor layer is reduced at the edge thereof; forming an oxide film to fill up the cavity by performing a thermal oxidation treatment on the second semiconductor layer and the semiconductor substrate through the aperture; and forming a gate electrode on the second semiconductor layer with a gate insulating film interposed therebetween; and forming source/drain layers in regions of the second semiconductor layer having a smaller thickness so as to be disposed at both sides of the gate electrode, respectively.

According to the above-mentioned structure, it is possible to remove the first semiconductor layer with the second semiconductor layer remaining, and to reduce the thickness of the second semiconductor layer at the edge thereof. Accordingly, a BOX layer can be formed to have a small thickness below the cannel and to have a large thickness below the source/drain layers, without damaging the crystal quality of the second semiconductor layer. Thus, it is possible to suppress a short channel effect and to reduce parasitic capacitance of the source/drain layers, without using the SIMOS technique. As a result, it is possible to prevent an increase in manufacturing costs, and to achieve transistors capable of operating at high speed with low power consumption.

Further, in the above-mentioned aspect of the invention, it is preferable that, in the etching of the first semiconductor layer and the second semiconductor layer, a portion of the first semiconductor layer be removed by using an etching solution having a low selectivity between the first semiconductor layer and the second semiconductor layer, and then the remaining portion of the first semiconductor layer be removed by using an etching solution having a high selectivity between the first semiconductor layer and the second semiconductor layer.

In this way, it is possible to increase the etching amount of the first semiconductor layer at the edge thereof, and to reduce the etching amount of the first semiconductor layer at the center thereof. As a result, it is possible to make the thickness of the first semiconductor layer uniform at the center thereof, and to reduce the thickness of the first semiconductor layer at the edge thereof.

Furthermore, according to yet still another aspect of at least one embodiment of the invention, a method of manufacturing a semiconductor device includes forming a first semiconductor layer on a part of a semiconductor substrate so as to have a non-uniform thickness; forming a second semiconductor layer on the first semiconductor layer, the second semiconductor layer having a selectivity lower than that of the first semiconductor layer at the time of etching; forming an insulating film on the semiconductor substrate so as to cover the second semiconductor layer; forming an aperture in the insulating film, so that a part of an edge of the first semiconductor layer is exposed through the aperture; etching the first semiconductor layer through the aperture to form, below the second semiconductor layer, a cavity where the first semiconductor layer is removed; forming an oxide film having a non-uniform thickness to fill up the cavity by performing a thermal oxidation treatment on the second semiconductor layer and the semiconductor substrate through the aperture; forming a gate electrode on the second semiconductor layer with a gate insulating film interposed therebetween; and forming source/drain layers in regions of the second semiconductor layer corresponding to portions of the oxide film having a larger thickness so as to be disposed at both sides of the gate electrode, respectively.

According to the above-mentioned structure, it is possible to make the second semiconductor layer have a non-uniform thickness, corresponding to the first semiconductor layer having a non-uniform thickness. Accordingly, a BOX layer can be formed to have a small thickness below the cannel and to have a large thickness below the source/drain layers, without damaging the crystal quality of the second semiconductor layer. Thus, it is possible to suppress a short channel effect and to reduce parasitic capacitance of the source/drain layers, without using the SIMOS technique. As a result, it is possible to prevent an increase in manufacturing costs, and to achieve transistors capable of operating at high speed with low power consumption.

BRIEF DESCRIPTION OF THE DRAWINGS

The invention will be described with reference to the accompanying drawings, wherein like numbers reference like elements, and wherein.

DESCRIPTION OF THE EMBODIMENTS

Hereinafter, a method of manufacturing a semiconductor device according to an embodiment of the invention will be described with reference to the accompanying drawings.

Figure 2A:
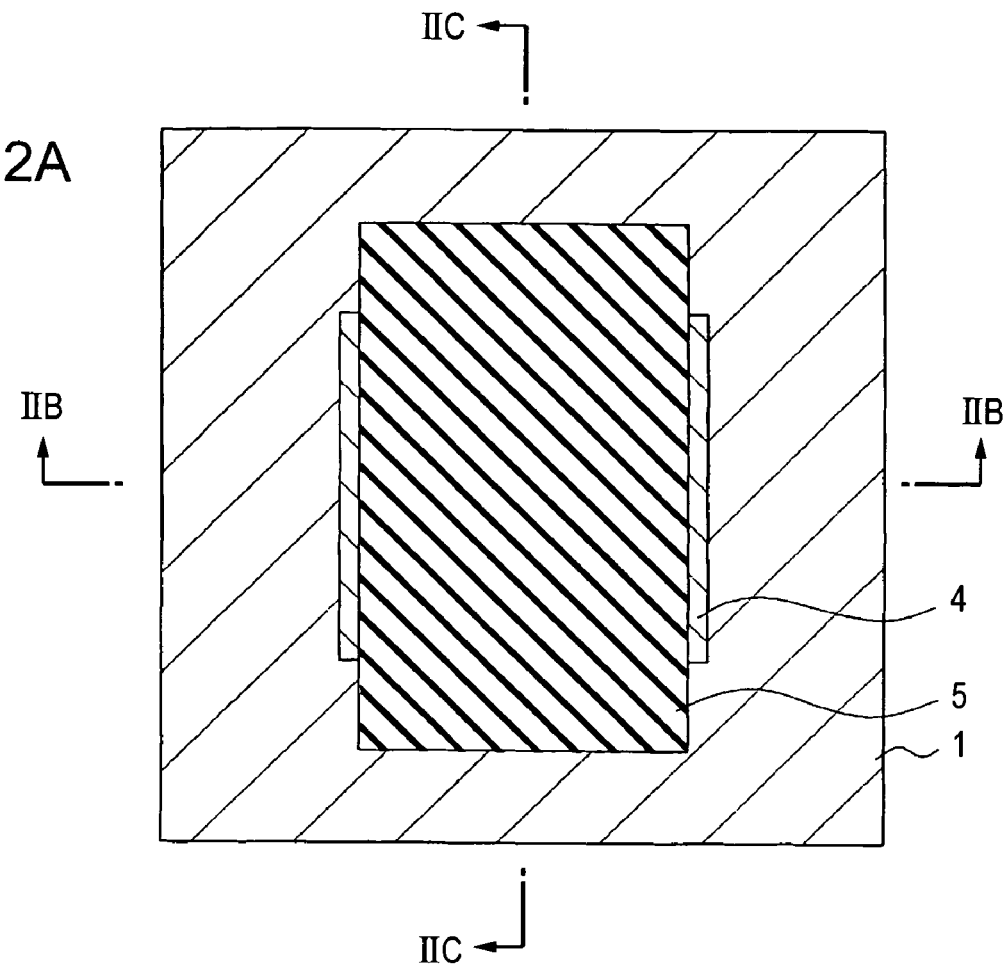
FIG. 2A is a plan view illustrating the method of manufacturing the semiconductor device according to the first embodiment of the invention.
Figure 2B:
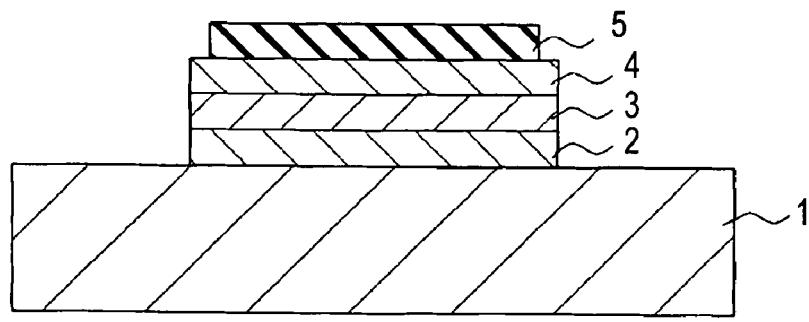
FIG. 2B is a cross-sectional view taken along the line IIB-IIB of FIG. 2A.
Figure 2C:
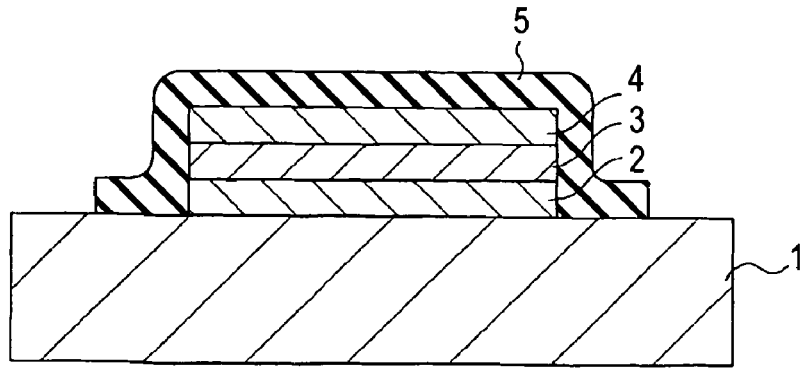
FIG. 2C is a cross-sectional view taken along the line IIC-IIC of FIG. 2A.
Figure 3A:
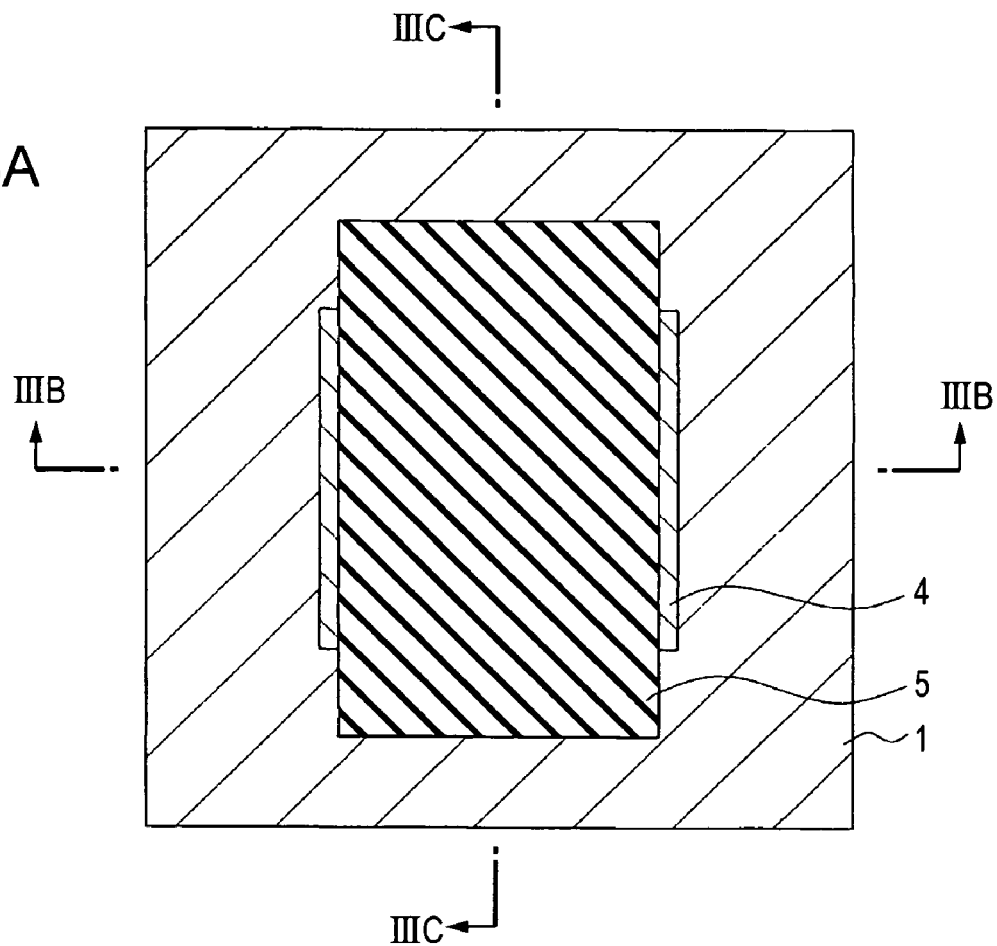
FIG. 3A is a plan view illustrating the method of manufacturing the semiconductor device according to the first embodiment of the invention.
Figure 3B:
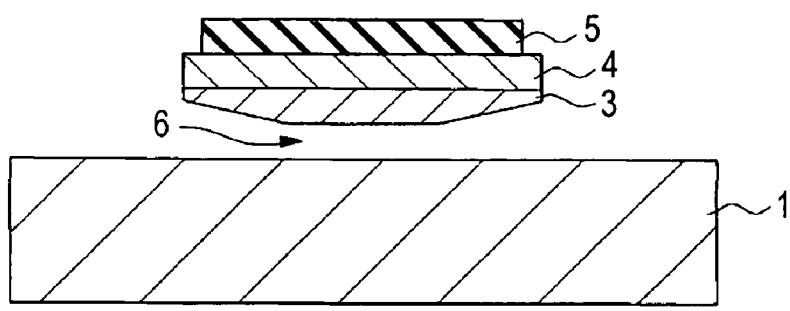
FIG. 3B is a cross-sectional view taken along the line IIIB-IIIB of FIG. 3A.
Figure 3C:
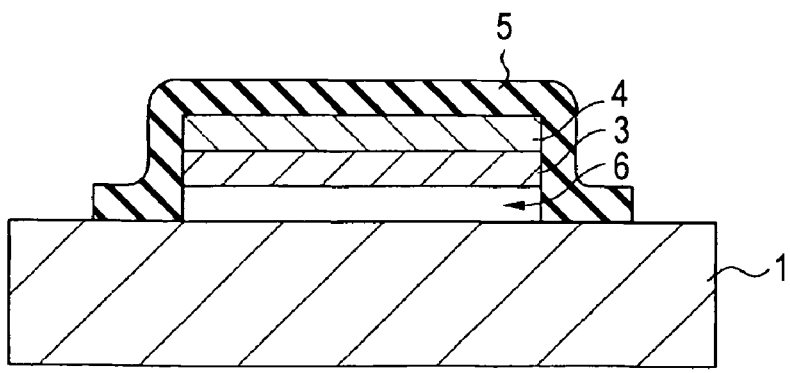
FIG. 3C is a cross-sectional view taken along the line IIIC-IIIC of FIG. 3A.

FIGS. 1A to 1C and 4A to 4C are cross-sectional views illustrating a method of manufacturing a semiconductor device according to a first embodiment of the invention. FIGS. 2A and 3A are plan views illustrating the method of manufacturing the semiconductor device according to the first embodiment of the invention. FIG. 2B is a cross-sectional view taken along the line IIB-IIB of FIG. 2A, and FIG. 2C is a cross-sectional view taken along the line IIC-IIC of FIG. 2A. FIG. 3B is a cross-sectional view taken along the line IIIB-IIIB of FIG. 3A, and FIG. 3C is a cross-sectional view taken along the line IIIC-IIIC of FIG. 3A.

Figure 1A:
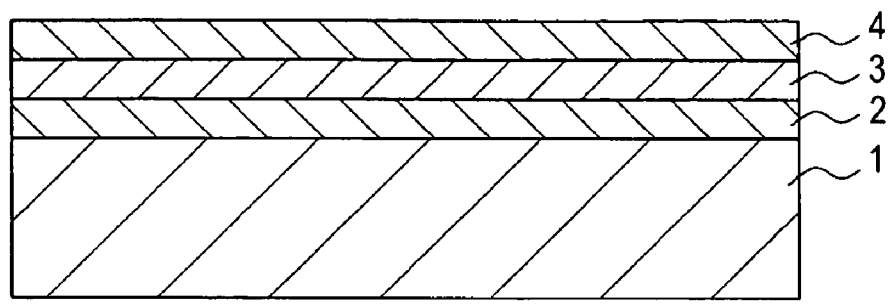
FIG. 1A is a cross-sectional view illustrating a method of manufacturing a semiconductor device according to a first embodiment of the invention.

Referring to FIG. 1A, a first semiconductor layer 2 and a second semiconductor layer 3 are sequentially formed on a semiconductor substrate 1 by performing epitaxial growth. The semiconductor substrate 1 can be made of, for example, Si, Ge, SiGe, SiC, SiSn, PbS, GaAs, InP, FaP, GaN, or ZnSe. The first semiconductor layer 2 can be made of a material having a selectivity higher than those of the semiconductor substrate 1 and the second semiconductor layer 3 at the time of etching, and semiconductor substrate 1 and the second semiconductor layer 3 can be made of a combination of materials selected from, for example, Si, Ge, SiGe, SiC, SiSn, PbS, GaAs, InP, FaP, GaN, and ZnSe. In particular, when the semiconductor substrate 1 is made of Si, it is preferable that SiGe be used for the first semiconductor layer 2 and Si be used for the second semiconductor layer 3, and selectivity can be secured between the first semiconductor layer 2 and the second semiconductor layer 3 at the time of etching. Further, the first and second semiconductor layers 2 and 3 can be formed, for example, with a thickness of about 10 to 200 nm, respectively. In addition, a silicon oxide film 4 is formed on the second semiconductor layer 3 by, for example, a CVD method.

Figure 1B:
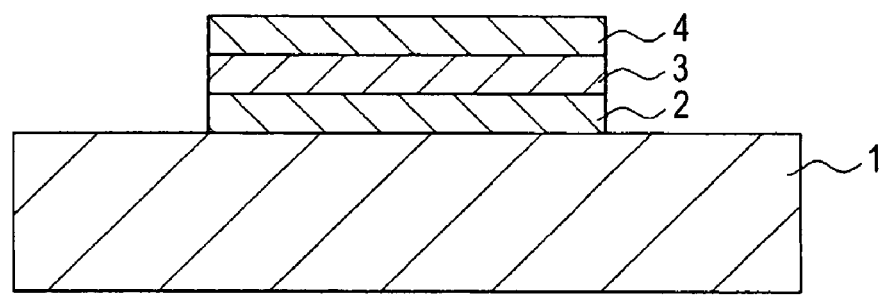
FIG. 1B is a cross-sectional view illustrating the method of manufacturing the semiconductor device according to the first embodiment of the invention.

Then, as shown in FIG. 1B, the first semiconductor layer 2, the second semiconductor layer 3, and the silicon oxide film 4 are patterned by photolithography and etching techniques to expose a portion of the semiconductor layer 1 around the second semiconductor layer 3, thereby separating the second semiconductor layer 3. In addition, the second semiconductor layer 3 may be separated by selective epitaxial growth of the first and second semiconductor layers 2 and 3.

Figure 1C:
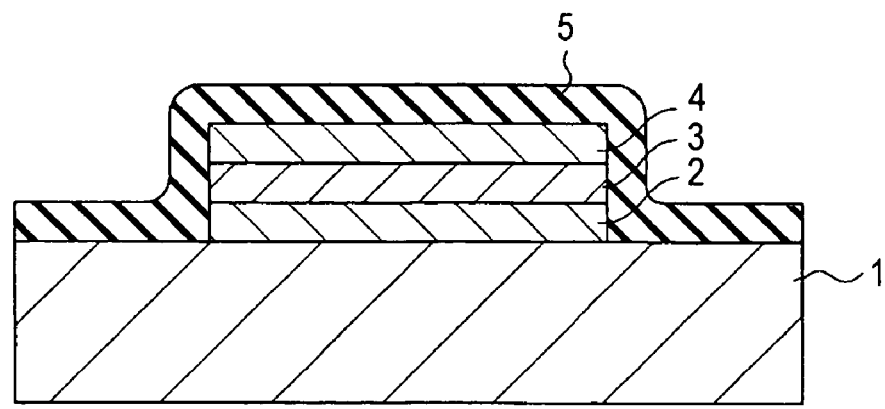
FIG. 1C is a cross-sectional view illustrating the method of manufacturing the semiconductor device according to the first embodiment of the invention.

Subsequently, as shown in FIG. 1C, a support insulating film 5 is formed on the silicon oxide film 4 so as to cover the second semiconductor layer 3 by, for example, a CVD method. The support insulating film 5 can be composed of, for example, a silicon nitride film or a silicon oxide film.

Next, as shown in FIGS. 2A to 2C, patterning is performed on the support insulating film 5 using the photolithography and etching techniques to form an aperture in the support insulating film 5, so that a portion of the edge of the first semiconductor layer 2 is exposed through the aperture. When a portion of the edge of the first semiconductor layer 2 is exposed, the remaining portion of the edge of the first semiconductor layer 2 is covered with the support insulating film 5.

Then, as shown in FIGS. 3A to 3C, an etching gas or etching solution comes into contact with the first semiconductor layer 2 and the second semiconductor layer 3 through the aperture formed in the support insulating film 5 to remove the first semiconductor layer 2 by etching. In this way, a cavity 6 is formed between the semiconductor substrate 1 and the second semiconductor layer 3, and thus the thickness of the second semiconductor layer 3 is reduced at both ends thereof.

In this embodiment, since the aperture for exposing a portion of the edge of the second semiconductor layer 3 is formed in the support insulating film 5, it is possible to make an etching gas or etching solution come into contact with the first semiconductor layer 2 formed underneath the second semiconductor layer 3, and to form the cavity 6 between the semiconductor substrate 1 and the second semiconductor layer 3. In addition, since the remaining portion of the edge of the first semiconductor layer 2 is covered with the support insulating film 5, it is possible to support the second semiconductor layer 3 on the semiconductor substrate 1 with the support insulating film 5, although the first semiconductor layer 2 is removed.

Further, when the semiconductor substrate 1 and the second semiconductor layer 3 are made of Si and the first semiconductor layer 2 is made of SiGe, it is desirable to use fluoronitric acid as an etching solution for the first semiconductor layer 2. Thereby, it is possible to obtain the selectivity between Si and SiGe in a range of about 1:100 to 1:1000. Also, it is possible to remove the first semiconductor layer 2 while preventing the semiconductor substrate 1 and the second semiconductor layer 3 from being overetched. However, when the first semiconductor layer 2 is removed by etching to reduce the thickness of the second semiconductor layer 3 at both ends thereof, it is preferable to set the selectivity between Si and SiGe to be low. When the selectivity between Si and SiGe is lowered, for example, the concentration of hydrofluoric acid can be set to 0.3%, and the concentration of nitric acid can be set to 15 to 25%.

Further, in order to make the thickness of the second semiconductor layer 3 uniform at the center thereof when the first semiconductor layer 2 is removed by etching, the first semiconductor layer 2 may be etched to some extent by an etching solution having a low selectivity between Si and SiGe, and then etched by an etching solution having a high selectivity between Si and SiGe. When the selectivity between Si and SiGe is high, for example, the concentration of hydrofluoric acid can be set to 0.3%, and the concentration of nitric acid can be set to 30 to 40%.

Figure 4A:
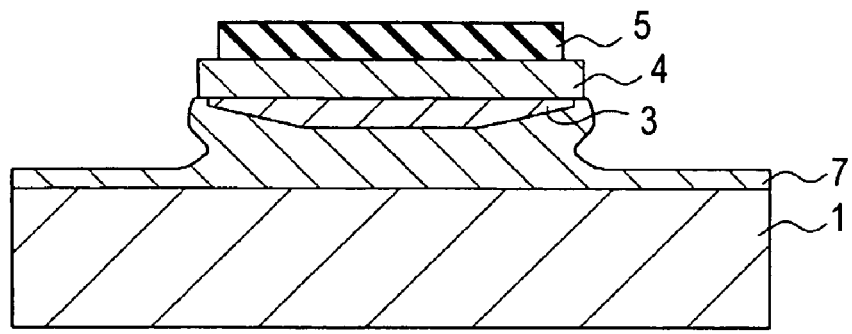
FIG. 4A is a cross-sectional view illustrating the method of manufacturing the semiconductor device according to the first embodiment of the invention.

Subsequently, as shown in FIG. 4A, by performing a thermal oxidation treatment on the semiconductor substrate 1 and the second semiconductor layer 3, an oxide film 7 is formed on the semiconductor substrate 1 so as to fill up the cavity 6 formed between the semiconductor substrate 1 and the second semiconductor layer 3. In addition, after the oxide film 7 is formed, high-temperature annealing may be performed. In this case, by reducing the thickness of the second semiconductor layer 3 at both ends thereof, it is possible to make the oxide film 7 have a larger thickness at both ends of the second semiconductor layer 3 than at the center thereof, and thus to make a BOX layer have a non-uniform thickness. In addition, the oxide film 7 may be formed on the semiconductor substrate 1 so as to fill up the cavity 6 by, for example, a CVD method other than the method of performing the thermal oxidation treatment on the semiconductor substrate 1 and the second semiconductor layer 3.

Figure 4B:
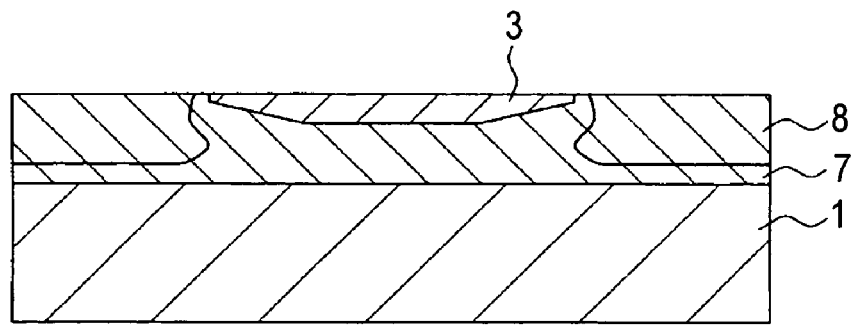
FIG. 4B is a cross-sectional view illustrating the method of manufacturing the semiconductor device according to the first embodiment of the invention.

Then, as shown in FIG. 4B, an oxide film 8 is formed on the entire surface of the semiconductor substrate 1 such that the second semiconductor layer 3 is buried in the oxide film 8. Subsequently, CMP (chemical mechanical polishing) is performed thereon to planarize the oxide film 8 and to expose the surface of the second semiconductor layer 3.

Figure 4C:
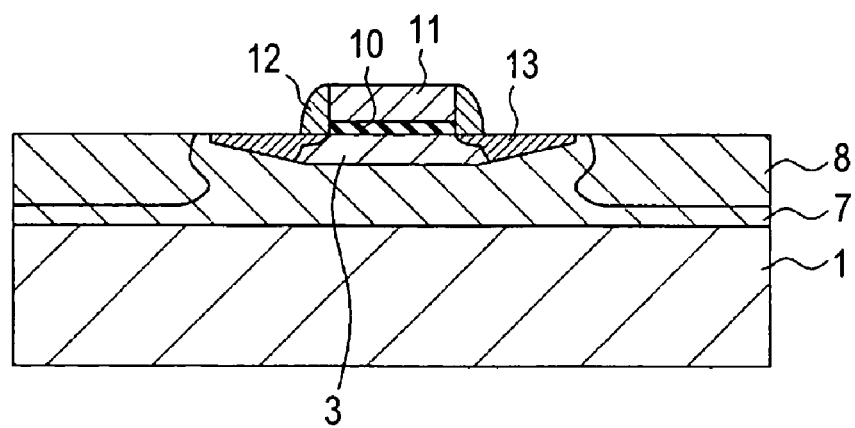
FIG. 4C is a cross-sectional view illustrating the method of manufacturing the semiconductor device according to the first embodiment of the invention.

Successively, as shown in FIG. 4C, a thermal oxidation treatment is performed on the surface of the second semiconductor layer 3 to form a gate insulating film 10 on the second semiconductor layer 3. Then, a polycrystalline silicon layer is formed on the second semiconductor layer 3 having the gate insulating film 10 formed thereon using, for example, the CVD method. Subsequently, the polycrystalline silicon layer is patterned by the photolithography and etching techniques to thereby form a gate electrode 11 on the second semiconductor layer 3. In this case, the gate electrode 11 can be arranged in a region where the thickness of the oxide film 7 is small.

Next, by ion-implanting impurities, such as As, P, and B, into the second semiconductor layer 3 using the gate electrode 11 as a mask, LDD layers, which are composed of layers having impurities lightly doped therein, are formed on the second semiconductor layer 3 so as to be disposed at both sides of the gate electrode 11. Then, an insulating layer is formed on the second semiconductor layer 3 having the LDD layers formed thereon by, for example, the CVD method, and the insulating layer is etched by anisotropic etching, such as RIE, thereby forming a sidewall 12 around the gate electrode 11. Subsequently, by ion-implanting impurities, such as As, P, and B, into the second semiconductor layer 3 using the gate electrode 11 and the sidewall 12 as a mask, source/drain layers 13, which are composed of layers having impurities heavily doped therein, are formed on portions of the second semiconductor layer 3 having a smaller thickness that are disposed on outer sides of the sidewall 12.

In this way, it is possible to decrease the thickness of the BOX layer below a channel and to increase the thickness of the BOX layer below the source/drain layers 13, without damaging the crystal quality of the second semiconductor layer 3. Therefore, it is possible to suppress a short channel effect without using a SIMOX method, and to reduce the parasitic capacitance of the source/drain layers 13. As a result, it is possible to reduce manufacturing costs and to achieve transistors capable of operating at high speed with lower power consumption.

Figure 6A:
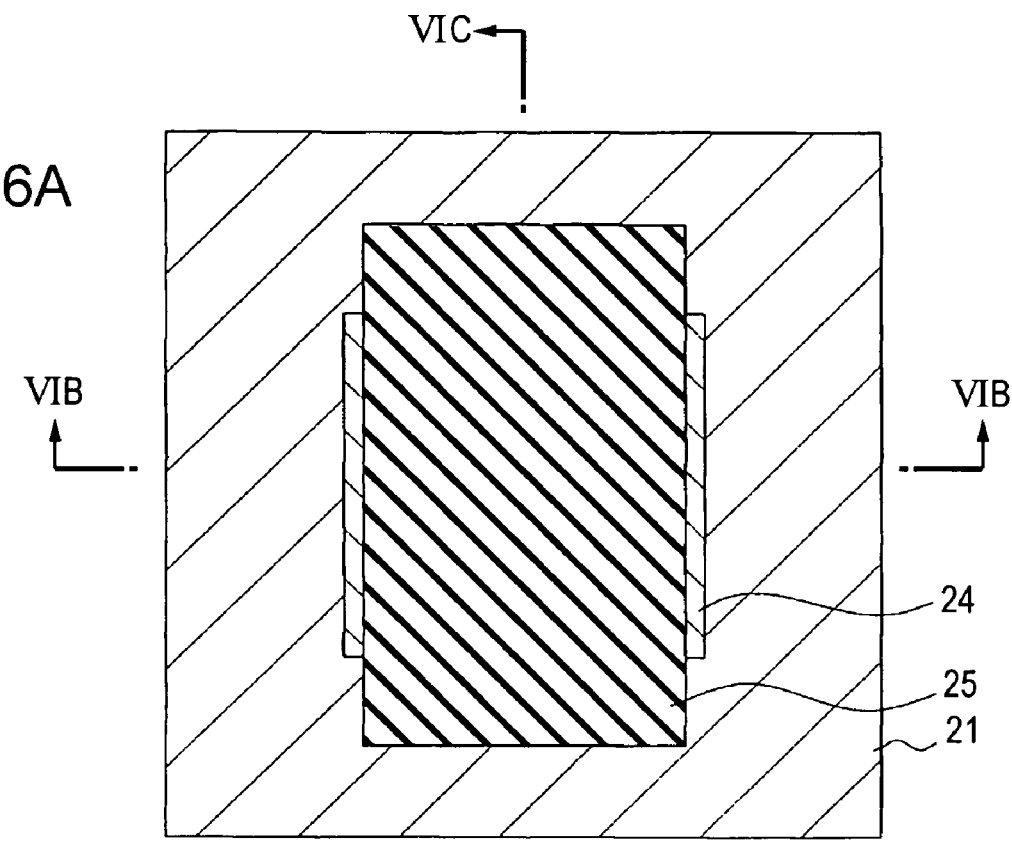
FIG. 6A is a plan view illustrating the method of manufacturing the semiconductor device according to the second embodiment of the invention.
Figure 6B:
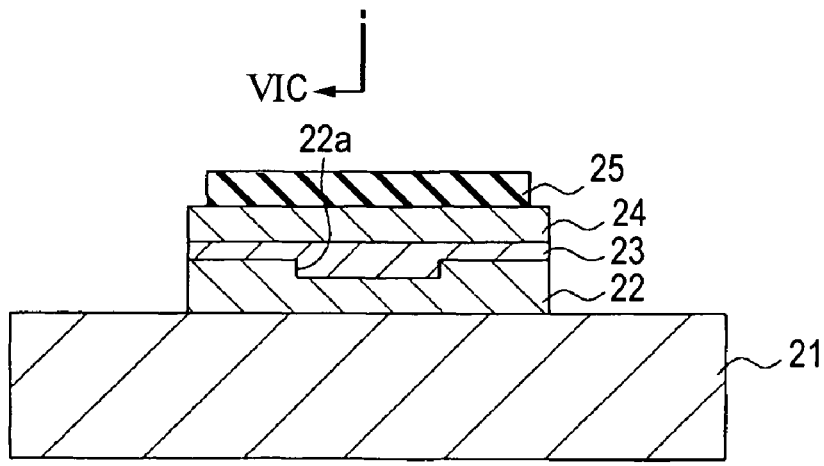
FIG. 6B is a cross-sectional view taken along the line VIB-VIB of FIG. 6A.
Figure 6C:
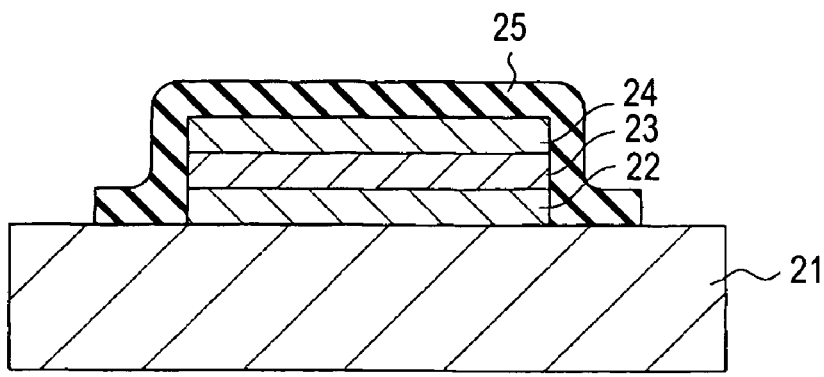
FIG. 6C is a cross-sectional view taken along the line VIC-VIC of FIG. 6A.
Figure 7A:
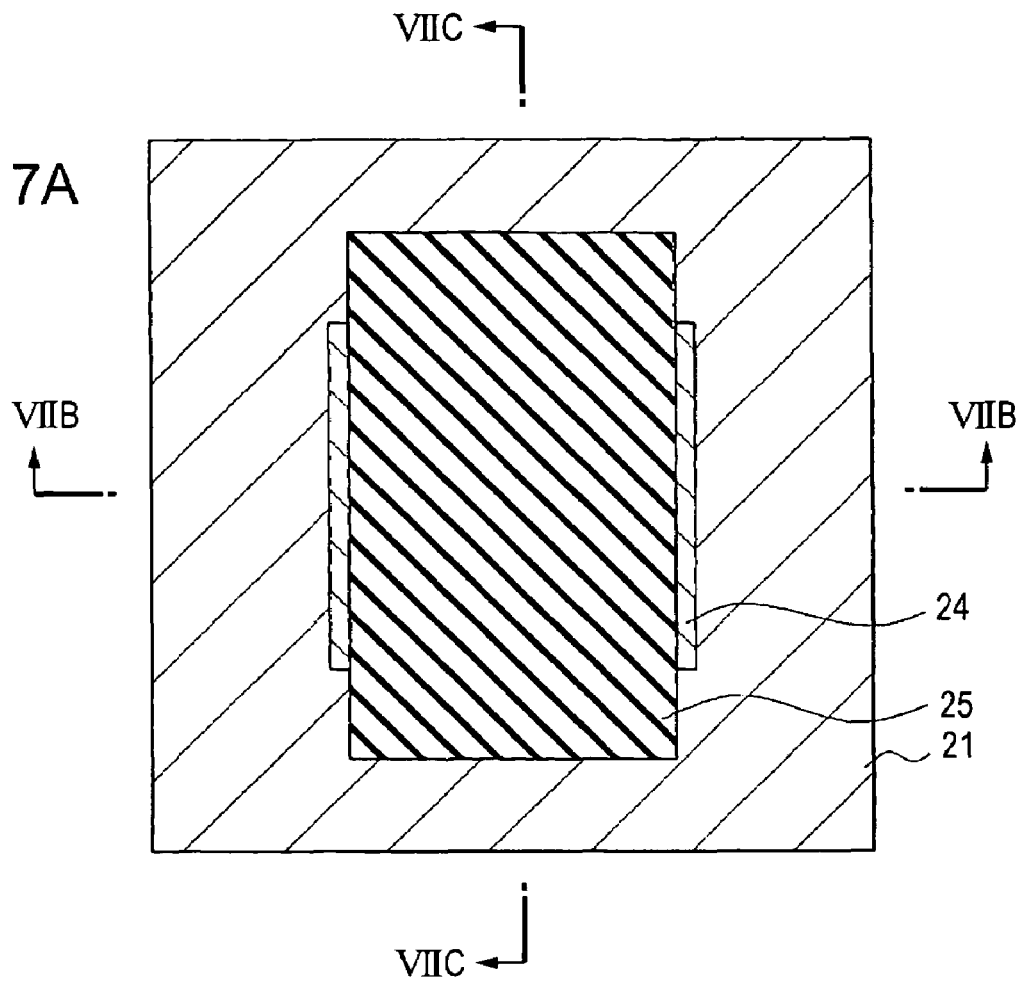
FIG. 7A is a plan view illustrating the method of manufacturing the semiconductor device according to the second embodiment of the invention.
Figure 7B:
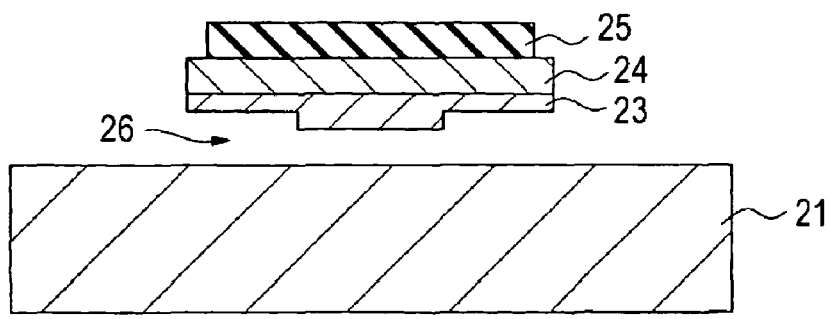
FIG. 7B is a cross-sectional view taken along the line VIIB-VIIB of FIG. 7A.
Figure 7C:
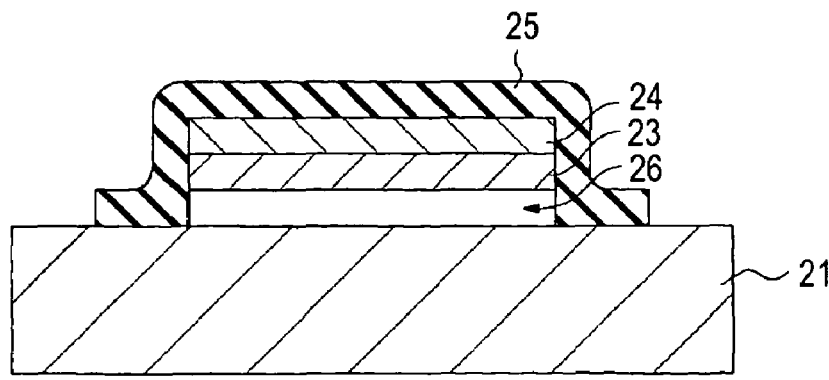
FIG. 7C is a cross-sectional view taken along the line VIIC-VIIC of FIG. 7A.

FIGS. 5A to 5D and 8A to 8C are cross-sectional views illustrating a method of manufacturing a semiconductor device according to a second embodiment of the invention. FIGS. 6A and 7A are plan views illustrating the method of manufacturing the semiconductor device according to the second embodiment of the invention. FIG. 6B is a cross-sectional view taken along the line VIB-VIB of FIG. 6A, and FIG. 6C is a cross-sectional view taken along the line VIC-VIC of FIG. 6A. FIG. 7B is a cross-sectional view taken along the line VIIB-VIIB of FIG. 7A, and FIG. 7C is a cross-sectional view taken along the line VIIC-VIIC of FIG. 7A.

Figure 5A:
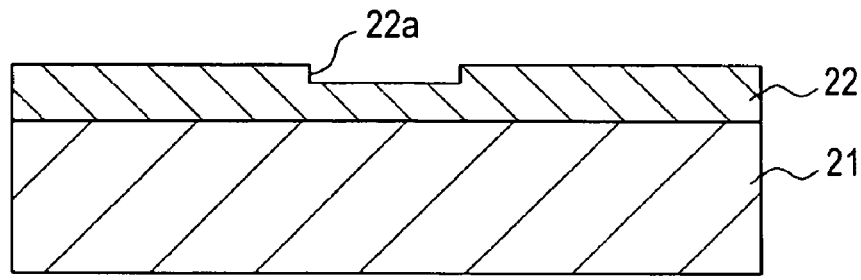
FIG. 5A is a cross-sectional view illustrating a method of manufacturing a semiconductor device according to a second embodiment of the invention.

Referring to FIG. 5A, a first semiconductor layer 22 is formed on a semiconductor substrate 21 by performing epitaxial growth. The first semiconductor substrate 21 is patterned by photolithography and etching techniques, so that a concave portion 22a is formed in the first semiconductor layer 22.

Figure 5B:
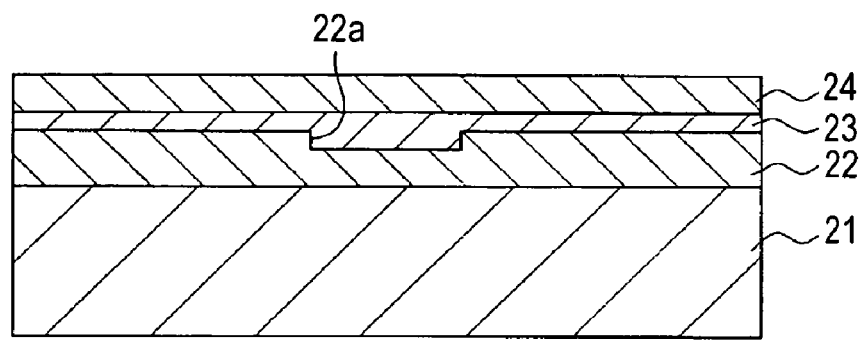
FIG. 5B is a cross-sectional view illustrating the method of manufacturing the semiconductor device according to the second embodiment of the invention.

Then, as shown in FIG. 5B, a second semiconductor layer 23 is formed on the first semiconductor layer 22 having the concave portion 22a therein by performing epitaxial growth. In this case, since the second semiconductor layer 23 is formed on the first semiconductor layer 22 having the concave portion 22a therein, it is possible to make the second semiconductor layer 23 have a non-uniform thickness. In addition, the first semiconductor layer 22 can be made of a material having a higher selectivity than those of the semiconductor substrate 21 and the second semiconductor layer 23 at the time of etching. In particular, when the semiconductor substrate 21 is made of Si, preferably, the first semiconductor layer 22 is made of SiGe, and the second semiconductor layer 23 is made of Si. Then, a silicon oxide film 24 is formed on the second semiconductor layer 23 by, for example, a CVD method.

Figure 5C:
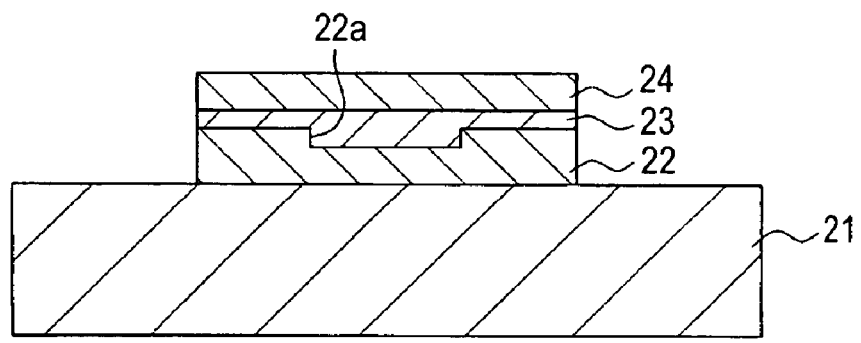
FIG. 5C is a cross-sectional view illustrating the method of manufacturing the semiconductor device according to the second embodiment of the invention.

Next, as shown in FIG. 5C, the first semiconductor layer 22, the second semiconductor layer 23, and the silicon oxide film 24 are patterned by photolithography and etching techniques to expose a portion of the semiconductor substrate 21 around the second semiconductor layer 23, thereby separating the second semiconductor layer 23.

Figure 5D:
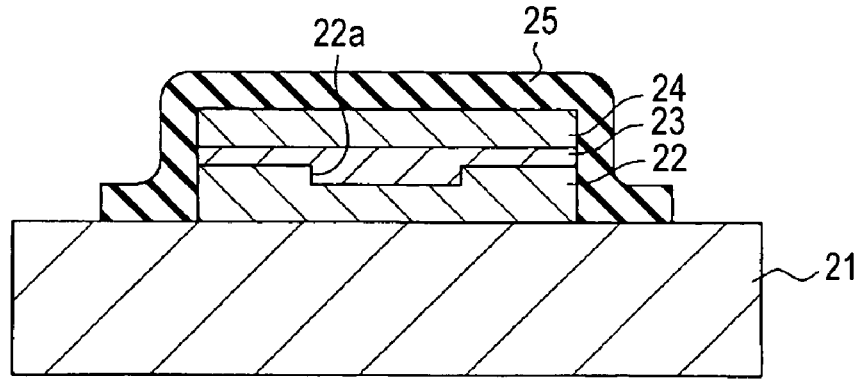
FIG. 5D is a cross-sectional view illustrating the method of manufacturing the semiconductor device according to the second embodiment of the invention.

Subsequently, as shown in FIG. 5D, a support insulating film 25 is formed on the silicon oxide film 24 so as to cover the second semiconductor layer 23 by, for example, a CVD method.

Next, as shown in FIGS. 6A to 6C, patterning is performed on the support insulating film 25 using the photolithography and etching techniques to form an aperture in the support insulating film 25, so that a portion of the edge of the first semiconductor layer 22 is exposed through the aperture. When a portion of the edge of the first semiconductor layer 22 is exposed, the remaining portion of the edge of the first semiconductor layer 22 is covered with the support insulating film 25.

Then, as shown in FIGS. 7A to 7C, an etching gas or etching solution comes into contact with the first semiconductor layer 22 through the aperture formed in the support insulating film 25 to remove the first semiconductor layer 22 by etching. In this way, a cavity 26 is formed between the semiconductor substrate 21 and the second semiconductor layer 23.

In this embodiment, since the aperture for exposing a portion of the edge of the first semiconductor layer 22 is formed in the support insulating film 25, it is possible to make an etching gas or etching solution come into contact with the first semiconductor layer 22 formed underneath the second semiconductor layer 23, and to form the cavity 26 between the semiconductor substrate 21 and the second semiconductor layer 23. In addition, since the remaining portion of the edge of the first semiconductor layer 22 is covered with the support insulating film 25, it is possible to support the second semiconductor layer 23 on the semiconductor substrate 21 with the support insulating film 25, although the first semiconductor layer 22 is removed.

Figure 8A:
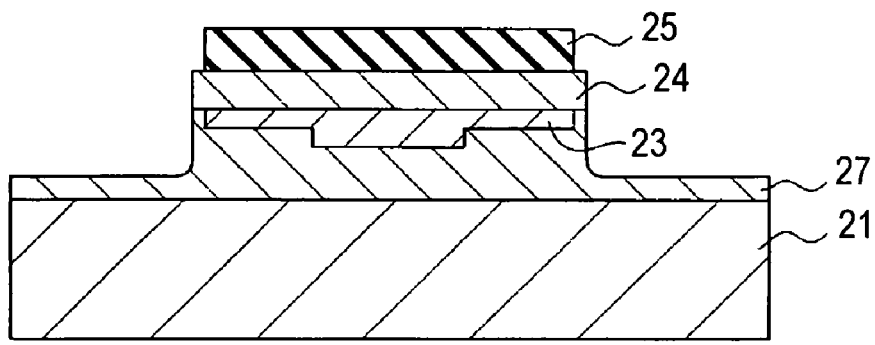
FIG. 8A is a cross-sectional view illustrating the method of manufacturing the semiconductor device according to the second embodiment of the invention.

Subsequently, as shown in FIG. 8A, by performing a thermal oxidation treatment on the semiconductor substrate 21 and the second semiconductor layer 23, an oxide film 27 is formed on the semiconductor substrate 21 so as to fill up the cavity 26 formed between the semiconductor substrate 21 and the second semiconductor layer 23. In addition, after the oxide film 27 is formed, high-temperature annealing may be performed. In this case, by making the thickness of the second semiconductor layer 23 non-uniform, it is possible to make the oxide film 27 formed in the cavity 26 have a non-uniform thickness, and thus to make a BOX layer have a non-uniform thickness. In addition, the oxide film 27 may be formed on the semiconductor substrate 21 so as to fill up the cavity 26 by, for example, a CVD method other than the method of performing the thermal oxidation treatment on the semiconductor substrate 21 and the second semiconductor layer 23.

Figure 8B:
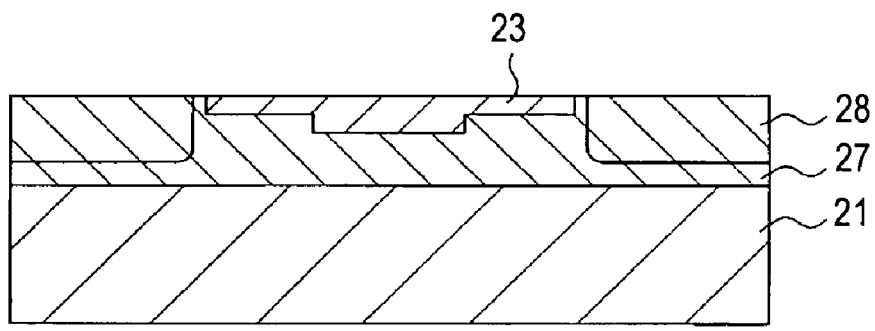
FIG. 8B is a cross-sectional view illustrating the method of manufacturing the semiconductor device according to the second embodiment of the invention.

Then, as shown in FIG. 8B, an oxide film 28 is formed on the entire surface of the semiconductor substrate 21 such that the second semiconductor layer 23 is buried in the oxide film 28. Subsequently, CMP is performed thereon to planarize the oxide film 28, so that the surface of the second semiconductor layer 23 is exposed.

Figure 8C:
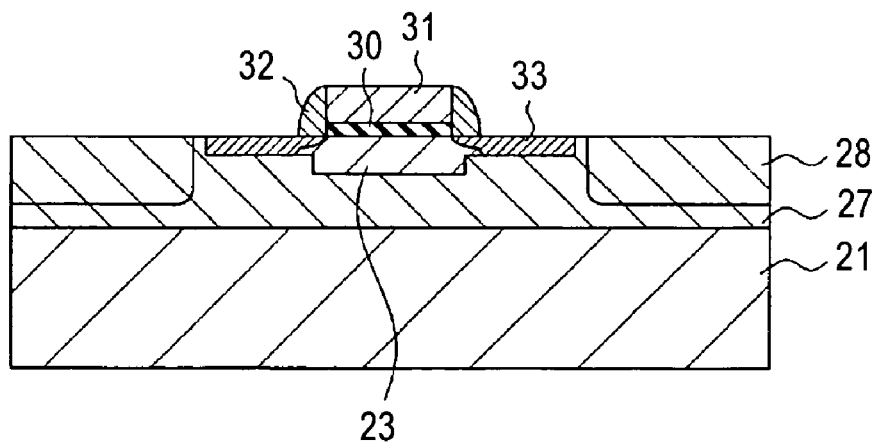
FIG. 8C is a cross-sectional view illustrating the method of manufacturing the semiconductor device according to the second embodiment of the invention.

Successively, as shown in FIG. 8C, a thermal oxidation treatment is performed on the surface of the second semiconductor layer 23 to form a gate insulating film 30 on the second semiconductor layer 23. Then, a polycrystalline silicon layer is formed on the second semiconductor layer 23 having the gate insulating film 30 formed thereon using, for example, the CVD method. Subsequently, the polycrystalline silicon layer is patterned by the photolithography and etching techniques to thereby form a gate electrode 31 on the second semiconductor layer 23. In this case, the gate electrode 31 can be arranged in a region where the thickness of the oxide film 27 is small.

Next, by ion-implanting impurities, such as As, P, and B, into the second semiconductor layer 23 using the gate electrode 31 as a mask, LDD layers which are composed of layers having impurities lightly doped therein are formed on the second semiconductor layer 23 so as to be disposed at both sides of the gate electrode 31. Then, an insulating layer is formed on the second semiconductor layer 23 having the LDD layers formed thereon by, for example, the CVD method, and the insulating layer is etched by anisotropic etching, such as RIE, thereby forming a sidewall 32 around the gate electrode 31. Subsequently, by ion-implanting impurities, such as As, P, and B, into the second semiconductor layer 23 using the gate electrode 31 and the sidewall 32 as a mask, source/drain layers 32, which are composed of layers having impurities heavily doped therein, are formed in regions of the second semiconductor layer 23 that are disposed on outer sides of the sidewall 32 corresponding to portions of the oxide film 27 having a larger thickness.

In this way, it is possible to make the thickness of second semiconductor layer 23 non-uniform, corresponding to the first semiconductor layer 22 having a non-uniform thickness. In addition, it is possible to decrease the thickness of the BOX layer below a channel, and to increase the thickness of the BOX layer below the source/drain layers 33, without damaging the crystal quality of the second semiconductor layer 23. Therefore, it is possible to suppress a short channel effect without using a SIMOX method, and to reduce parasitic capacitance of the source/drain layers. As a result, it is possible to reduce manufacturing costs and to achieve transistors capable of operating at high speed with lower power consumption.

What is claimed is:

1. A method of manufacturing a semiconductor substrate, comprising:
    forming a first semiconductor layer on a part of the semiconductor substrate;
    forming a second semiconductor layer on the first semiconductor layer, the second semiconductor layer having an etching rate to a first etching solution lower than an etching rate to the first etching solution of the first semiconductor layer;
    forming an insulating film on the semiconductor substrate so as to cover the first semiconductor layer and the second semiconductor layer;
    forming an aperture in the insulating film, so that a part of an edge of the first semiconductor layer and a part of an edge of the second semiconductor layer are exposed through the aperture;
    forming a cavity below the second semiconductor layer by etching the first semiconductor layer through the aperture by using the first etching solution; and
    forming a first oxide film to fill up the cavity;
    wherein the forming of the cavity including:
    removing a first portion of the first semiconductor layer by using a second etching solution such that a second portion of the first semiconductor layer remains; and
    removing the second portion of the first semiconductor layer by using the first etching solution,
    a first difference between an etching rate of the first semiconductor layer to the first etching solution and an etching rate of the second semiconductor layer to the first etching solution being larger than a second difference between an etching rate of the first semiconductor layer to the second etching solution and an etching rate of the second semiconductor layer to the second etching solution.

2. A method of manufacturing a semiconductor device, comprising:
    forming a first semiconductor layer on a part of a semiconductor substrate;
    forming a second semiconductor layer on the first semiconductor layer, the second semiconductor layer having an etching rate to a first etching solution lower than an etching rate to the first etching solution of the first semiconductor layer;

forming an insulating film on the semiconductor substrate so as to cover the first semiconductor layer and the second semiconductor layer;

forming an aperture in the insulating film, so that a part of an edge of the first semiconductor layer and a part of an edge of the second semiconductor layer are exposed through the aperture;

forming a cavity below the second semiconductor layer by etching the first semiconductor layer through the aperture by using the first etching solution;

forming a first oxide film to fill up the cavity;

forming a gate electrode on the second semiconductor layer with a gate insulating film interposed between the gate electrode and the second semiconductor layer;

forming a source region and a drain region in the second semiconductor layer;

forming a second oxide film on the semiconductor substrate to fill up at least the aperture after the forming of the first oxide film; and removing a part of the insulating film and a part of the second oxide film to expose an upper face of the second semiconductor layer, wherein the forming of the second oxide film and the removing of the part of the insulating film and the part of the second oxide film are executed between the forming of the first oxide film and the forming of the source region and the drain region.

3. A method of manufacturing a semiconductor device according to the claim 2, the semiconductor device is formed in order the forming of the first semiconductor layer, the forming of the second semiconductor layer, the forming of the insulating film, the forming of the aperture, the forming of the cavity, the forming of the first oxide film, the forming of the gate electrode and the forming of the source region and the drain region.

4. A method of manufacturing a semiconductor device according to the claim 2, the forming of the cavity including:

forming a first portion at the second semiconductor layer that has a first thickness and a second portion at the second semiconductor layer that has a second thickness being larger than the first thickness by etching a part of the second semiconductor layer with the etching of the first semiconductor layer.

5. A method of manufacturing a semiconductor device according to the claim 4, wherein the gate electrode is formed at the second portion of the second semiconductor layer.

6. A method of manufacturing a semiconductor device, comprising:

forming a first semiconductor layer that includes a first portion and a second portion on a part of a semiconductor substrate, the first portion having a first thickness and the second portion having a second thickness larger than the first thickness;

forming a second semiconductor layer on the first semiconductor layer, the second semiconductor layer having an etching rate to a first etching solution lower than an etching rate to the first etching solution of the first semiconductor layer, and the second semiconductor layer including a third portion that has a third thickness on the first portion and a fourth portion that has a fourth thickness smaller than the third thickness on the second portion;

forming an insulating film on the semiconductor substrate so as to cover the first semiconductor layer and the second semiconductor layer;

forming an aperture in the insulating film, so that a part of an edge of the first semiconductor layer and a part of an edge of the second semiconductor layer are exposed through the aperture;

forming a cavity below the second semiconductor layer by etching the first semiconductor layer through the aperture by using the first etching solution;

forming an oxide film to fill up the cavity;

forming a gate electrode on the third portion of the second semiconductor layer with a gate insulating film interposed between the gate electrode and the second semiconductor layer; and forming a source region and a drain region in the second semiconductor layer.

7. A method of manufacturing a semiconductor substrate, comprising:

forming a first semiconductor layer on a part of the semiconductor substrate;

forming a second semiconductor layer on the first semiconductor layer, the second semiconductor layer having an etching rate to a first etching solution lower than an etching rate to the first etching solution of the first semiconductor layer;

forming an insulating film on the semiconductor substrate so as to cover the first semiconductor layer and the second semiconductor layer;

forming an aperture in the insulating film, so that a part of an edge of the first semiconductor layer and a part of an edge of the second semiconductor layer are exposed through the aperture;

forming a cavity below the second semiconductor layer by etching the first semiconductor layer through the aperture by using the first etching solution; and forming a first oxide film to fill up the cavity;

forming a second oxide film on the semiconductor substrate to fill up at least the aperture after the forming of the first oxide film; and removing a part of the insulating film and a part of the second oxide film to expose an upper face of the second semiconductor layer, the forming of the second oxide film and the removing of the part of the insulating film and the part of the second oxide film are executed between the forming of the first oxide film and the forming of the source region and the drain region.

8. A method of manufacturing a semiconductor substrate, comprising:

forming a first semiconductor layer on a part of the semiconductor substrate;

forming a second semiconductor layer on the first semiconductor layer, the second semiconductor layer having an etching rate to a first etching solution lower than an etching rate to the first etching solution of the first semiconductor layer;

forming an insulating film on the semiconductor substrate so as to cover the first semiconductor layer and the second semiconductor layer;

forming an aperture in the insulating film, so that a part of an edge of the first semiconductor layer and a part of an edge of the second semiconductor layer are exposed through the aperture;

forming a cavity below the second semiconductor layer by etching the first semiconductor layer through the aperture by using the first etching solution; and forming a first oxide film to fill up the cavity;
the forming of the cavity including:
forming a first portion at the second semiconductor layer that has a first thickness and a second portion at the second semiconductor layer that has a second thickness being larger than the first thickness by etching a part of the second semiconductor layer with the etching of the first semiconductor layer.

9. A method of manufacturing a semiconductor substrate, comprising:
   forming a first semiconductor layer on a part of the semiconductor substrate;
   forming a second semiconductor layer on the first semiconductor layer, the second semiconductor layer having an etching rate to a first etching solution lower than an etching rate to the first etching solution of the first semiconductor layer;
   forming an insulating film on the semiconductor substrate so as to cover the first semiconductor layer and the second semiconductor layer;
   forming an aperture in the insulating film, so that a part of an edge of the first semiconductor layer and a part of an edge of the second semiconductor layer are exposed through the aperture;
   forming a cavity below the second semiconductor layer by etching the first semiconductor layer through the aperture by using the first etching solution; and
   forming a first oxide film to fill up the cavity;
   forming a first semiconductor layer on a part of a semiconductor substrate;
   forming a second semiconductor layer on the first semiconductor layer, the second semiconductor layer having an etching rate to a first etching solution lower than an etching rate to the first etching solution of the first semiconductor layer;
   forming an insulating film on the semiconductor substrate so as to cover the first semiconductor layer and the second semiconductor layer;
   forming an aperture in the insulating film, so that a part of an edge of the first semiconductor layer and a part of an edge of the second semiconductor layer are exposed through the aperture;
   forming a cavity below the second semiconductor layer by etching the first semiconductor layer through the aperture by using the first etching solution;
   forming a first oxide film to fill up the cavity;
   forming a gate electrode on the second semiconductor layer with a gate insulating film interposed between the gate electrode and the second semiconductor layer; and
   forming a source region and a drain region in the second semiconductor layer;
   forming a second oxide film on the semiconductor substrate to fill up at least the aperture after the forming of the first oxide film; and
   planarizing the second oxide film to expose an upper face of the second semiconductor layer,
   the forming of the second oxide film and the planarizing of the second oxide film are executed between the forming of the first oxide film and the forming of the source region and the drain region.

10. A method of manufacturing a semiconductor substrate, comprising:
    forming a first semiconductor layer that includes a first portion and a second portion on a part of a semiconductor substrate, the first portion having a first thickness and the second portion having a second thickness larger than the first thickness;
    forming a second semiconductor layer on the first semiconductor layer, the second semiconductor layer having an etching rate to a first etching solution lower than an etching rate to the first etching solution of the first semiconductor layer, and the second semiconductor layer including a third portion that has third thickness on the first portion and a fourth portion that has fourth thickness smaller than the third thickness on the second portion;
    forming an insulating film on the semiconductor substrate so as to cover the first semiconductor layer and the second semiconductor layer;
    forming an aperture in the insulating film, so that a part of an edge of the first semiconductor layer and a part of an edge of the second semiconductor layer are exposed through the aperture;
    forming a cavity below the second semiconductor layer by etching the first semiconductor layer through the aperture by using the first etching solution; and
    forming an oxide film to fill up the cavity.

* * * * *